United States Patent [19]

Klingbeil, Jr. et al.

[11] Patent Number: 5,821,170

[45] Date of Patent: Oct. 13, 1998

[54] METHOD FOR ETCHING AN INSULATING MATERIAL

[75] Inventors: Lawrence S. Klingbeil, Jr.; Terry K. Daly, both of Chandler, Ariz.

[73] Assignee: Motorola, Inc., Schaumburg

[21] Appl. No.: 720,511

[22] Filed: Sep. 30, 1996

[51] Int. Cl.$^6$ ..................................... C23F 1/00

[52] U.S. Cl. .................. 438/745; 438/748; 438/756; 438/757; 216/102; 216/96; 252/79.5; 252/79.1

[58] Field of Search ................... 438/745, 748, 438/756, 757; 216/102, 96; 252/79.5, 79.1

[56] References Cited

U.S. PATENT DOCUMENTS

| | | | |
|---|---|---|---|
| 4,239,661 | 12/1980 | Muraoka et al. | 438/745 |
| 4,943,540 | 7/1990 | Ren et al. | 438/745 |
| 5,127,984 | 7/1992 | Hua et al. | 438/748 |
| 5,447,874 | 9/1995 | Grivna et al. | 437/40 |
| 5,484,740 | 1/1996 | Cho | 437/40 |
| 5,512,518 | 4/1996 | Cho et al. | 437/235 |

*Primary Examiner*—Deborah Jones
*Attorney, Agent, or Firm*—Rennie William Dover

[57] ABSTRACT

A method for etching aluminum containing layers. A layer (13) of aluminum nitride is formed on a semiconductor substrate (11). The layer (13) of aluminum nitride is etched using a dilute ammonium hydroxide solution that is diluted with water such that the ammonium hydroxide solution has one part of ammonium hydroxide to at least fifteen parts of water. The dilute ammonium hydroxide solution is showered onto the semiconductor substrate and forms an aluminum hydroxide layer. The aluminum hydroxide layer is dissolved by excess water in the dilute aluminum hydroxide solution and rinsed from the semiconductor substrate (11).

23 Claims, 2 Drawing Sheets

METHOD FOR ETCHING AN INSULATING MATERIAL

BACKGROUND OF THE INVENTION

The present invention relates, in general, to semiconductor processing techniques, and more particularly, to semiconductor etch processing techniques.

Semiconductor processing techniques typically include etch steps to form openings in layers or to remove layers that are no longer needed. For example, an aluminum containing dielectric layer may be formed on a silicon nitride layer to serve as an etch stop layer. The aluminum nitride layer is typically etched with a strong acid or a strong base to remove exposed portions of the aluminum nitride layer. A drawback to the use of an aluminum nitride film over a silicon nitride film is that etching of the aluminum nitride with strong bases or acids leaves a residual aluminum nitride layer. This residual aluminum nitride or possibly reacted aluminum nitride prevents reliable processing of the layers beneath the residual aluminum nitride film. Another drawback of prior art ammonium hydroxide solutions is that they do not etch thermally cycled aluminum nitride films.

Accordingly, it would be advantageous to have a method for etching aluminum containing dielectric layers that permits removal of all the aluminum from the layer on which it is disposed. It would be of further advantage for the method to provide a means for etching a layer of aluminum nitride having a patterned layer of photoresist disposed thereon. Other desirable features include the ability of the method to remove an aluminum oxide-silicon oxide layer, improve the transient behavior of the semiconductor device, and to improve etch variation across a semiconductor wafer.

DETAILED DESCRIPTION OF THE DRAWINGS

The present invention provides a method for etching a dielectric material containing aluminum. One use of the present invention is in the manufacture of semiconductor devices. For example, in the manufacture of compound semiconductor devices, aluminum nitride serves as an etch stop layer to protect underlying films and/or the active regions of the device. This invention permits complete removal of the aluminum nitride layer to permit further processing.

Figure 1:
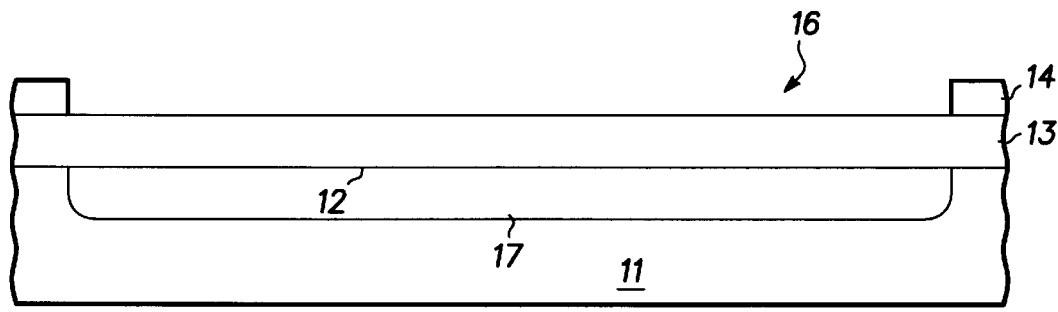
FIGS. 1–2 are cross-sectional views of a semiconductor device at early stages of fabrication in accordance with the present invention.

FIG. 1 illustrates a cross-sectional view of a semiconductor device during an early stage of manufacture in accordance with the present invention. What is shown in FIG. 1 is a semiconductor material 11 having a major surface 12 and a dielectric layer or insulating material 13 disposed thereon. Suitable materials for semiconductor material 11 include gallium arsenide (GaAs), indium phosphide (InP), silicon (Si), silicon germanium (SiGe), epitaxially grown materials, and the like. By way of example, semiconductor material 11 is the compound semiconductor material gallium arsenide and dielectric layer 13 is an aluminum containing dielectric material such as aluminum nitride. Dielectric layer 13 serves as a cap layer or protective covering that prevents outgassing of semiconductor material 11 as well as a sacrificial etch stop layer. Preferably, dielectric layer 13 is formed by reactive sputtering of aluminum using argon and nitrogen or oxygen gases. Although, other processes, such as metalorganic chemical vapor deposition, may be used. By way of example, the thickness of dielectric layer 13 is between approximately 10 nanometers (nm) and approximately 50 nm and preferably between approximately 20 nm and approximately 30 nm.

Still referring to FIG. 1, a layer 14 of photoresist is formed on dielectric layer 13. Layer 14 is patterned to have an opening 16 that exposes a portion or region of aluminum nitride layer 13. A channel region 17 is formed in semiconductor material 11 using well known techniques. For example, channel region 17 can be formed by implanting silicon impurities through aluminum nitride layer 13 and into semiconductor material 11.

Figure 2:
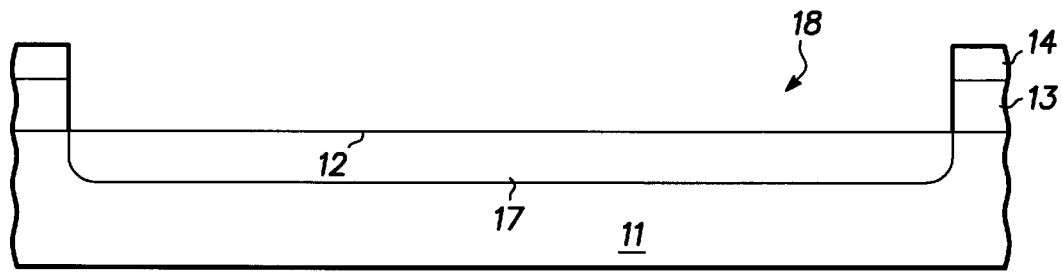

Now referring to FIG. 2, aluminum nitride layer 13 is etched in accordance with the present invention to expose a portion or region of major surface 12 and to form an active area 18 of semiconductor material 11. It should be noted that the same reference numbers are used in the figures to denote the same elements.

Figure 3:
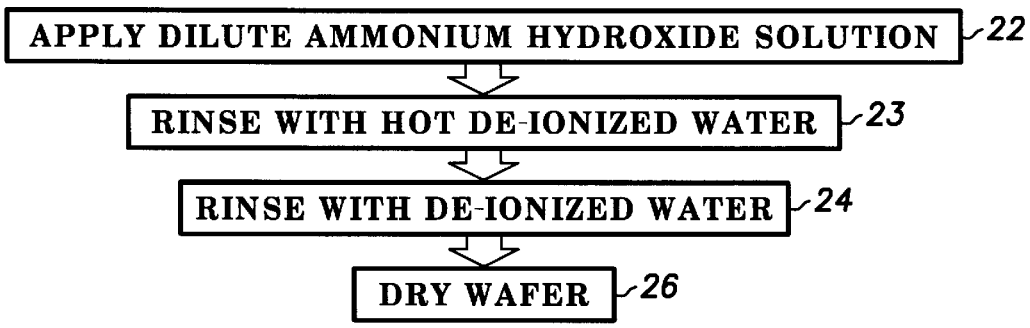
FIG. 3 is a flow diagram of an etch method in accordance with an embodiment of the present invention.

FIG. 3 is a flow diagram 20 showing the steps for etching or removing the exposed portions of aluminum nitride layer 13 in accordance with the present invention. As those skilled in the art are aware, semiconductor material 11 is typically in wafer form and the semiconductor processing is typically performed at the wafer level. In a first step (indicated by box 22), a hydroxide solution such as, for example, a dilute solution of ammonium hydroxide, is applied to the exposed portions of aluminum nitride layer 13. The temperature of the dilute solution of ammonium hydroxide is between approximately 10 degrees Celsius (°C.) and approximately 100° C. and preferably between approximately 30° C. and approximately 60° C.

It has been determined that using dilute ammonium hydroxide is an important feature of the present invention. The ammonium hydroxide solution is also referred to as an ammonia water solution. Although ammonium hydroxide has been used as the hydroxide solution, it should be noted this is not a limitation of the present invention. For example, the hydroxide solution can be a metal hydroxide solution, an organic hydroxide solution, an amino-hydroxide solution, or the like. More particularly, the dilution of the ammonium hydroxide should be between approximately one part of ammonium hydroxide to approximately 15 parts of water ($1NH_4OH:15H_2O$) and approximately one part of ammonium hydroxide to approximately one thousand parts of water ($1NH_4OH:1000H_2O$). The maximum amount of etch time is a function of the concentration of the ammonium hydroxide. For example, the etch time for the ammonium hydroxide solution comprising one part of ammonium hydroxide to fifteen parts of water is preferably less than or equal to thirty seconds; the etch time for the ammonium hydroxide solution comprising one part of ammonium hydroxide to fifty parts of water is preferably less than or equal to two minutes; the etch time for the ammonium hydroxide solution comprising one part of ammonium hydroxide to one hundred parts of water is preferably less than or equal to three minutes. A feature and advantage of using ammonium hydroxide having a dilution ratio of approximately one part of ammonium hydroxide to at least approximately fifteen parts of water is that the ammonium hydroxide does not degrade photoresist layer 14 (FIG. 1) or the adhesion of photoresist layer 14 to an underlying material. Because the etchant solution of the present invention is compatible with photoresist processes, aluminum nitride layer 13 can be formed on semiconductor material 11.

In a second step (indicated by box 23), the wafer is rinsed with hot de-ionized water, i.e., de-ionized water at a temperature of approximately 70 degrees Celsius (°C.). Although, ammonium hydroxide (Al(OH)$_3$) is more soluble in warm water, it should be understood that the temperature of the water is not a limitation of the present invention and that the temperature of the water may range from approximately 10° C. to approximately 100° C.

In a third step (indicated by box 24), the wafer is rinsed with de-ionized water. Then, in a fourth step (indicated by box 26) the wafer is dried. Techniques for drying wafers are well known to those skilled in the art.

In accordance with an example of the present invention, the etching and rinsing steps are performed under static conditions. In other words, the semiconductor wafer, i.e., semiconductor material 11, is dipped in a bath containing the dilute ammonium hydroxide and in a bath containing the de-ionized water.

In accordance with another example of the present invention, the etching and rinsing steps are performed under dynamic conditions. Thus, the dilute ammonium hydroxide solution is showered or sprayed onto aluminum nitride layer 13. By way of example, the flow rate at which the dilute ammonium hydroxide solution is showered onto aluminum nitride layer 13 is between approximately 10 liters per minute (2.5 gallons per minute) and 14 liters per minute (3.5 gallons per minute). A preferable flow rate is 12 liters per minute (3 gallons per minute). Then, the wafer is rinsed with de-ionized water (indicated by boxes 23 and 24), and dried (indicated by box 26). Tools for showering wafers with solutions are well known to those skilled in the art.

In accordance with yet another example of the present invention, the application of the dilute ammonium hydroxide solution (indicated by box 22) is performed in multiple steps. For example, the dilute ammonium hydroxide solution is showered or sprayed onto aluminum nitride layer 13 for one minute at a flow rate of 12 liters per minute (3 gallons per minute). The semiconductor wafer is rinsed for approximately 30 seconds with de-ionized water followed by another step of spraying the exposed aluminum nitride for one minute. Then, the wafer is rinsed with de-ionized water (indicated by boxes 23 and 24), and dried (indicated by box 26).

It has been discovered by the inventors of the present invention that aluminum hydroxide (Al(OH)$_3$) is formed when ammonium hydroxide reacts with the aluminum in the aluminum nitride. The aluminum hydroxide then forms over the remaining portion of aluminum nitride layer 13, i.e., the aluminum hydroxide passivates aluminum nitride layer 13. The reaction is limited by the amount of aluminum in the aluminum nitride layer that is available to react with the ammonium hydroxide. By passivating aluminum nitride layer 13, the aluminum hydroxide prevents the aluminum in aluminum nitride layer 13 from reacting with the ammonium hydroxide, thereby preventing further reaction from occurring. Then during rinsing, the aluminum hydroxide (Al(OH)$_3$) is rinsed off leaving behind additional aluminum nitride that hasn't reacted with the hydroxyl ions (OH$^-$) due to the self-passivation. Thus, residual or reacted aluminum nitride remains on major surface 12. The residual aluminum nitride affects the subsequent processing steps and degrades the electrical performance of the semiconductor devices being manufactured.

In accordance with the present invention, the dilute ammonium hydroxide provides enough water to solubilize the aluminum hydroxide at the same rate it is formed from, and on, aluminum nitride layer 13. In accordance with one aspect of the present invention, the flow rate and dilution at which the ammonium hydroxide solution is showered onto aluminum nitride layer 13 is set such that the rate at which the aluminum hydroxide is formed is equal to the rate at which it is solubilized and removed from semiconductor material 11. For example, when the ammonium hydroxide solution comprises one part of ammonium hydroxide to one hundred parts of water and is sprayed or showered at a flow rate of approximately 12 liters per minute (3 gallons per minute), the solubilization rate is approximately equal to the rate at which aluminum hydroxide (Al(OH)$_3$ is formed.

Accordingly, the inventors have developed a technique for making all of the aluminum nitride available for reaction with an ammonium hydroxide solution that has been diluted and showered on to the aluminum nitride. Thus, the method of the present invention ensures that all of the aluminum nitride is removed.

Figure 4:
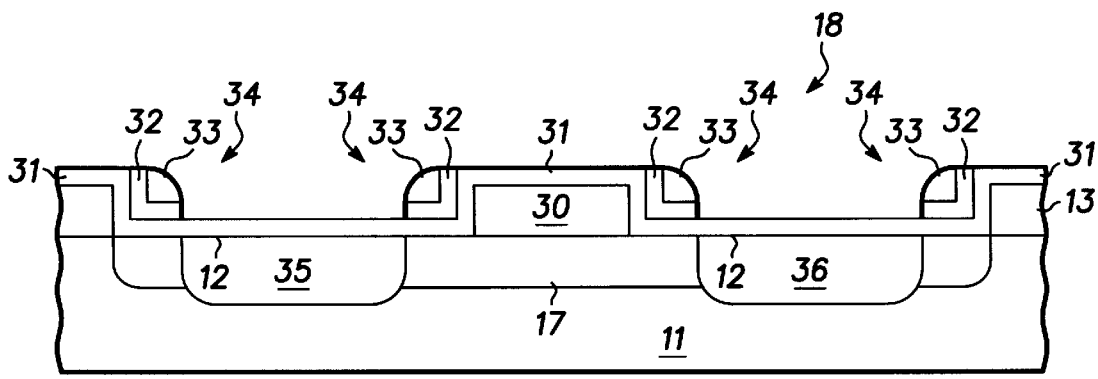
FIGS. 4–5 are cross-sectional views of the semiconductor device of FIG. 1 during fabrication in accordance with the present invention.

FIG. 4 illustrates the structure of FIG. 3 further along in processing. First, the remaining portions of photoresist layer 14 are removed using techniques well known to those skilled in the art. Then, a gate layer or structure 30 is formed over a portion of active area 18. Conventional photolithographic and etching techniques are used to form gate layer 30. When substrate 11 is a III–V compound semiconductor material such as, for example, gallium arsenide, gate layer 30 is preferably comprised of a refractory metal or metals such as titanium-tungsten-nitride, tungsten-silicon, tungsten-nitride, tungsten-silicon-nitride, among others.

Still referring to FIG. 4, an insulating layer 31 such as, for example, silicon nitride, is formed on the surface of the device including aluminum nitride layer 13, the exposed portion of major surface 12, and gate layer 30. Then, an insulating layer 32 comprised of aluminum is formed over insulating layer 31 and a dielectric layer 33 is formed over insulating layer 32. Dielectric layer 33 is dry etched using, for example, reactive ion etching having a fluorine based chemistry which selectively stops on insulating layer 32. Insulating layer 32 is wet etched using the etch method of the present invention to form sidewall spacers 34. The wet etch is selectively stopped on insulating layer 31, which serves as an implant screen for source and drain formation. Source and drain regions 35 and 36, respectively, are formed in portions of channel region 17 adjacent first and second sides of gate layer 30 and extend into semiconductor material 11 from major surface 12. Techniques for forming layers 31, 32, and 33, and regions 35 and 36 are well known to those skilled in the art.

Figure 5:
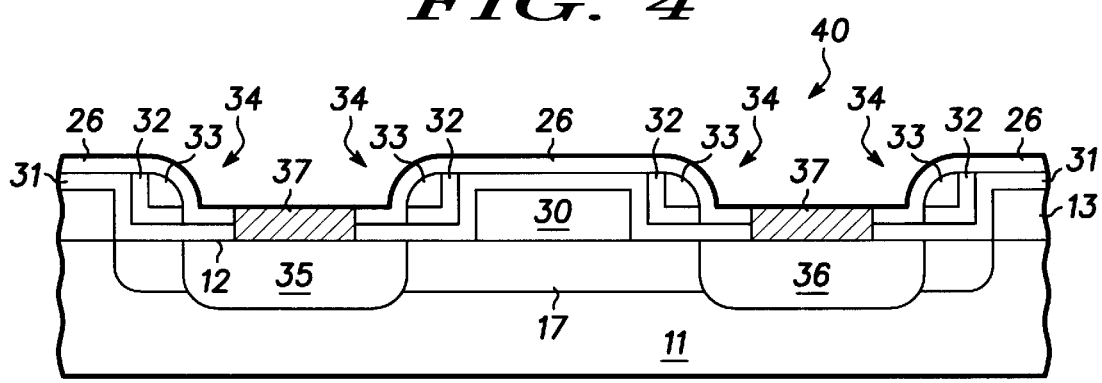

FIG. 5 illustrates the structure of FIG. 4 further along in processing. A silicon dioxide layer 26 is formed over the surface of the entire structure. A portion of silicon dioxide layer 26 may then be removed by a wet etch process using buffered hydrofluoric acid. Subsequently, a portion of silicon nitride layer 31 over source and drain regions 35 and 36, respectively, is removed using techniques known to those skilled in the art. An ohmic metal layer 37 is deposited and a lift-off technique is used to form electrical contact to source and drain regions 35 and 36, respectively, to form a semiconductor device 40. Ohmic metal 37 can be comprised of, for example, gold-germanium-nickel (AuGeNi), nickelgermanium-tungsten nitride (NiGeWN) or nickel-germanium-tungsten (NiGeW).

Alternatively, an ohmic metal layer (not shown) may be formed by removing the exposed portions of silicon nitride layer 31, depositing the ohmic metal layer, and etching to pattern the ohmic metal layer over source and drain regions 35 and 36, respectively. In this embodiment, a hard-mask layer (not shown) is preferably formed over gate layer 30 to prevent possible physical contact of the ohmic metal layer and gate layer 30 due to misalignment tolerances.

Figure 6:
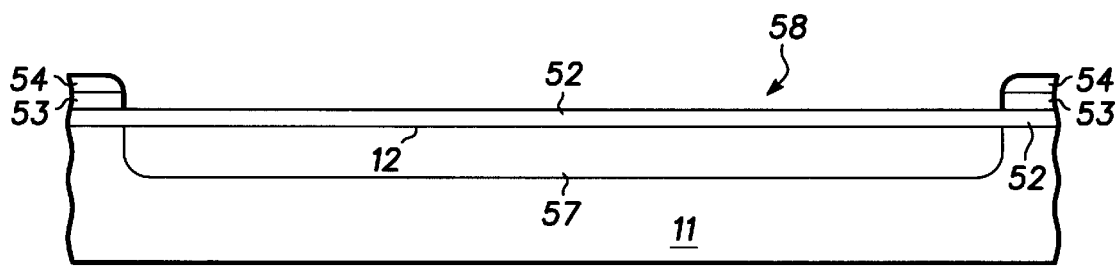
FIGS. 6–7 are cross-sectional views of another semiconductor device during various stages of manufacture in accordance with the present invention.

FIG. 6 illustrates a cross-sectional view of a semiconductor device at an early stage of manufacture in accordance with the present invention. What is shown in FIG. 6 is a semiconductor material 11 having a major surface 12 and a dielectric layer 52 disposed thereon. By way of example, semiconductor material 11 is gallium arsenide and dielectric layer 52 is silicon nitride. Dielectric layer 52 serves as a cap layer that prevents outgassing of semiconductor material 11. An aluminum containing dielectric material 53 such as, for example, aluminum nitride is formed on silicon nitride layer 52. Aluminum nitride layer 53 serves as a sacrificial etch stop layer. Preferably, dielectric layer 53 is formed by reactive sputtering of aluminum using argon and nitrogen or oxygen gases. Although, other processes, such as metal-organic chemical vapor deposition, may be used. By way of example, the thickness of dielectric layer 13 is between approximately 10 nm and approximately 50 nm and preferably between approximately 20 nm and approximately 30 nm.

Still referring to FIG. 6, a dielectric layer 54 comprised of silicon and oxygen is formed over dielectric layer 53. Suitable materials for dielectric layer 54 include silicon dioxide ($SiO_2$), silicon oxynitride ($SiO_xN_y$), and the like. Dielectric layer 14 may be formed using typical deposition processes, such as plasma enhanced chemical vapor deposition. The thickness of dielectric layer 54 is preferably between approximately 100 nm and approximately 700 nm in order to act as a mask for further ion implantation processes. A portion of dielectric layer 54 is photo-patterned and removed using a reactive ion etch (RIE). Dielectric layer 53 is then removed to form an opening over an active area 58, i.e., the area in semiconductor material 11 where the active portions of the semiconductor device are to be formed.

Dielectric layer 54 is removed using a reactive ion etch using a fluorine based plasma. Typical fluorine based plasmas include $C_2F_6$, $SF_6$, $NF_3$, $CF_4$, and $CHF_3$. A fluorocarbon based plasma is preferably used because of the controllability of the slope of the sidewall of the layer to be etched.

It is important to note that the fluorine based plasma does not etch dielectric layer 53 which is comprised of aluminum. This is important because surface 12 of semiconductor material 11 can be completely protected from the high power RIE used for the etching of dielectric layer 54. Because dielectric layer 53 in the present invention is an infinite etch stop for fluorine based plasmas, it will buffer all process fluctuations occurring during deposition and etching of dielectric layer 54.

Still referring to FIG. 6, aluminum nitride layer 53 is etched using the method described with reference to FIG. 3. It should be noted that the same reference numbers are used in the figures to denote the same elements. The etching of aluminum nitride layer 53 forms an active area 58 of semiconductor material 11. A channel region 57 is formed in active area 58 of semiconductor material 11 by implanting silicon impurities through silicon nitride layer 52. Other techniques for forming active area 58 are known to those skilled in the art.

Figure 7:
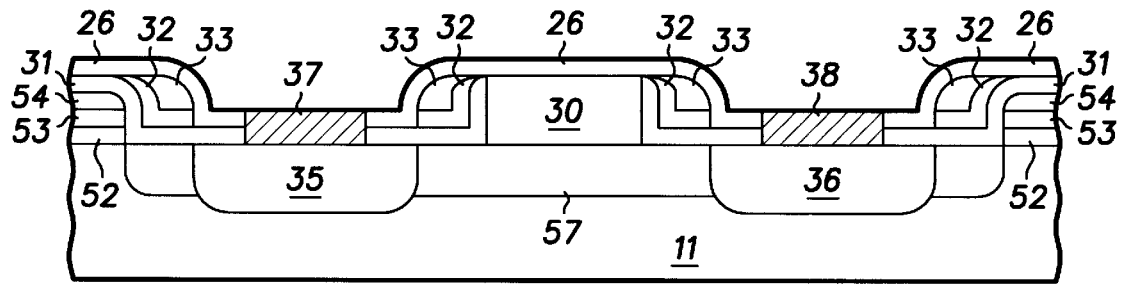

The exposed portion of silicon nitride layer 52 over active area 58 is removed using techniques known to those skilled in the art. After removal of silicon nitride layer 52, a gate layer 30, source and drain regions 35 and 36, respectively, and source and drain contacts 37 and 38, respectively, are formed using the steps as described with reference to FIGS. 2, 4, and 5. FIG. 7 illustrates a semiconductor device 71 after formation of source and drain contacts 37 and 38, respectively.

By now it should be appreciated that a method has been provided for removing aluminum containing material from a semiconductor substrate. The method of the present invention removes all of the aluminum in the exposed portions of dielectric layers containing aluminum. The present invention can be integrated into standard semiconductor process flows without adding additional processing equipment.

One aspect of the present invention is that it combines a high flow rate with a heavy dilution of an ammonium hydroxide solution to balance the formation of aluminum hydroxide by the heavily dilute ammonium hydroxide solution and the solubilization of the aluminum hydroxide by the high flow rate and the water in the dilute ammonium hydroxide solution., Further, the method of the present invention allows the removal of aluminum containing materials using an etchant that does not consume photoresist layers. This permits patterning of aluminum containing layers using photolithography, simplifying the manufacture of semiconductor devices. Because the method uses a heavily dilute ammonium hydroxide solution, it lowers the overall processing costs. Additional advantages include the ability to remove an aluminum oxide-silicon oxide layer, improvement of the transient behavior of the semiconductor device, and improvement of etch variation across a semiconductor wafer.

While specific embodiments of the invention have been shown and described, further modifications and improvements will occur to those skilled in the art. It is understood that this invention is not limited to the particular forms shown and it is intended for the appended claims to cover all modifications of the invention which fall within the true spirit and scope of the invention.

We claim:

1. A method for etching an insulating material, comprising the steps of:

providing a substrate;

forming the insulating material over the substrate; and removing a portion of the insulating material by exposing the portion of the insulating material to a dilute solution of ammonium hydroxide that comprises approximately one part ammonium hydroxide to at least approximately fifteen parts of water.

2. The method of claim 1, wherein the step of removing the portion of the insulating material includes showering the dilute solution of ammonium hydroxide onto the insulating material.

3. The method of claim 2, wherein showering the dilute solution of ammonium hydroxide onto the insulating material includes showering the dilute solution of ammonium hydroxide at a temperature ranging between approximately 10 degrees Celsius and approximately 100 degrees Celsius.

4. The method of claim 1, wherein the step of removing the portion of the insulating material includes:

showering the dilute solution of ammonium hydroxide onto the insulating material;

rinsing the dilute solution from the substrate; and showering more of the dilute solution of ammonium hydroxide onto the insulating material.

5. The method of claim 1, wherein the step of removing a portion of the insulating material by exposing the portion of the insulating material to a dilute solution of ammonium hydroxide includes exposing the portion of the insulating material to a dilute solution of ammonium hydroxide comprising one part of ammonium hydroxide to approximately one hundred parts of water.

6. The method of claim 1, wherein the step of removing the portion of the insulating material includes placing the substrate in a bath containing the dilute solution of ammonium hydroxide.

7. The method of claim 1, wherein the step of providing the substrate includes selecting the substrate from the group consisting of silicon and gallium arsenide.

8. The method of claim 1, wherein the substrate is a compound semiconductor material.

9. The method of claim 1, wherein the insulating material is aluminum nitride.

10. The method of claim 1, wherein the step of removing the portion of the insulating material includes forming a mask over a portion of the insulating material.

11. The method of claim 10, wherein the mask comprises an electrically nonconductive material.

12. The method of claim 11, wherein the mask comprises a material selected from the group consisting of photo resist and oxide.

13. A method for fabricating a semiconductor device, comprising the steps of:

providing a semiconductor substrate having a major surface;

forming a protective covering over the major surface;

removing a portion of the protective covering by exposing the portion of the protective covering to a dilute solution of ammonium hydroxide that comprises approximately one part of ammonium hydroxide to at least approximately fifteen parts of water;

forming a gate structure over the major surface; and forming source and drain regions in the semiconductor substrate, wherein the source and drain regions extend from the major surface into the semiconductor substrate and wherein the source region is adjacent a first side of the gate structure and the drain region is adjacent a second side of the gate structure.

14. The method of claim 13, wherein the semiconductor substrate is gallium arsenide.

15. The method of claim 13, wherein the protective covering over the major surface is aluminum nitride.

16. The method of claim 15, wherein the protective covering over the major surface further comprises a layer of silicon nitride between the major surface and the aluminum nitride layer.

17. The method of claim 13, wherein the step of removing the portion of the protective covering includes showering the dilute ammonium hydroxide onto the protective covering.

18. The method of claim 17, wherein the step of removing the portion of the protective covering includes exposing the portion of the protective covering to a dilute solution of ammonium hydroxide that comprises approximately one part of ammonium hydroxide to approximately one hundred parts of water.

19. The method of claim 17, wherein showering the dilute ammonium hydroxide solution onto the protective covering includes showering the dilute ammonium hydroxide at a rate ranging between approximately 8 liters per minute and approximately 14 liters per minute.

20. A method for etching aluminum nitride, comprising the steps of:

providing a semiconductor substrate;

forming the aluminum nitride on the semiconductor substrate; and showering a region of the aluminum nitride with a dilute solution of ammonium hydroxide that comprises one part of ammonium hydroxide to at least fifteen parts of water, wherein the dilute solution of ammonium hydroxide etches the region of the aluminum nitride.

21. The method of claim 20 further including the steps of:

rinsing the semiconductor substrate with water after showering the region of the aluminum nitride; and further showering the region with the dilute solution of ammonium hydroxide.

22. The method of claim 20, wherein the step of showering the region includes showering the region of the aluminum nitride with a dilute solution of ammonium hydroxide having a temperature ranging between approximately 30 degrees Celsius and approximately 60 degrees Celsius.

23. A method for etching an insulating material, comprising the steps of:

providing a substrate;

forming the insulating material over the substrate; and removing a portion of the insulating material by exposing the portion of the insulating material to a dilute hydroxide solution that comprises approximately one part of a hydroxide to at least approximately fifteen parts of water.

* * * * *